US010085364B2

(12) United States Patent
Voss (10) Patent No.: US 10,085,364 B2
(45) Date of Patent: Sep. 25, 2018

(54) SSD INTERNAL THERMAL TRANSFER ELEMENT (71) Applicant: Seagate Technology LLC, Cupertino, CA (US)

(72) Inventor: William Gunther Voss, Rosemount, MN (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 15/295,558

(22) Filed: Oct. 17, 2016

(65) Prior Publication Data

US 2018/0049349 A1 Feb. 15, 2018

Related U.S. Application Data (60) Provisional application No. 62/373,612, filed on Aug. 11, 2016.

(51) Int. Cl.
H05K 7/20 (2006.01)
H05K 1/02 (2006.01)
H01L 23/367 (2006.01)
H05K 1/14 (2006.01)
G06F 1/20 (2006.01)

(52) U.S. Cl.
CPC ........... *H05K 7/20436* (2013.01); *G06F 1/20* (2013.01); *H01L 23/367* (2013.01); *H05K 1/0203* (2013.01); *H05K 1/144* (2013.01)

(58) Field of Classification Search
CPC .. H05K 1/144; G06F 3/0679; G06F 2212/214
See application file for complete search history.

(56) References Cited

U.S. PATENT DOCUMENTS

| 5,436,794 | A | 7/1995 | Clemente et al. |
| 6,094,355 | A | 7/2000 | Vakilian |
| 7,408,776 | B2 * | 8/2008 | Campbell ............. H01L 23/473 165/80.4 |
| 7,800,065 | B2 | 9/2010 | Konkle et al. |
| 7,944,703 | B2 | 5/2011 | Ni et al. |
| 8,199,506 | B2 | 6/2012 | Janik et al. |
| 8,879,263 | B2 | 11/2014 | Gunderson |
| 9,078,357 | B2 | 7/2015 | Gunderson |
| 9,123,686 | B2 | 9/2015 | Mataya et al. |
| 2008/0130234 | A1 | 6/2008 | Maehara et al. |

(Continued)

Primary Examiner — Robert J Hoffberg
(74) Attorney, Agent, or Firm — Kagan Binder, PLLC (57) ABSTRACT An assembly includes a drive housing and a first printed circuit board (PCB) with at least one solid-state memory component, the first PCB having a first surface, where the first PCB is located within the drive housing. The assembly also includes a second PCB with at least one solid-state memory component, where the second PCB is operatively electronically coupled to the first PCB, the second PCB having a second surface, and where the second PCB is located within the drive housing. The assembly also includes a first thermal transfer element configured for partial thermal communication between the first PCB and the second PCB through the first and second surfaces, where the first thermal transfer element is shaped to include a partially thermally insulating air gap located between the first and the second PCB, and where the first thermal transfer element is in thermal communication with the drive housing.

20 Claims, 5 Drawing Sheets (56) References Cited

U.S. PATENT DOCUMENTS

| | | |
|---|---|---|
| 2009/0086431 A1 | 4/2009 | Sakamoto et al. |
| 2011/0038123 A1 | 2/2011 | Janik et al. |
| 2011/0199748 A1* | 8/2011 | Kagawa ............. H05K 7/20436 |
| | | 361/796 |
| 2013/0250504 A1 | 9/2013 | Choi |
| 2015/0062823 A1 | 3/2015 | Seo et al. |
| 2015/0124397 A1 | 5/2015 | Dean et al. |
| 2015/0208550 A1 | 7/2015 | Rugg |
| 2015/0261265 A1 | 9/2015 | Dean et al. |
| 2016/0004284 A1 | 1/2016 | Cohen et al. |
| 2017/0060199 A1* | 3/2017 | Kim .......................... G06F 1/20 |

\* cited by examiner

SSD INTERNAL THERMAL TRANSFER ELEMENT

PRIORITY CLAIM

The present non-provisional application claims the benefit of commonly owned provisional Application having Ser. No. 62/373,612, filed on Aug. 11, 2016, which provisional application is incorporated herein by reference in its entirety.

BACKGROUND

The present disclosure relates to aspects of data storage drives, and relates in particular to thermal management in solid-state drives.

Various memory-based data storage drives, such as solid-state drives (SSDs), are formed of a multitude of integrated circuits. Typically an SSD includes one or more printed circuit boards (PCBs), each with solid-state non-volatile-type and/or volatile-type memory or storage components located thereon. A common example of non-volatile memory is NAND memory, and examples of volatile memory include random-access memory (RAM) variations. Solid-state non-volatile memory components for use in an SSD are typically "persistent," meaning they do not lose data when power is cut off to the memory components. An example SSD may include two PCBs, stacked and spaced vertically, with each PCB containing various solid-state components, and the PCBs may together be located or mounted according to various layouts inside a single drive housing or enclosure.

An SSD typically lacks moving parts (in contrast to a hard-disk drive, which contains at least one spinning magnetic disk), but an SSD may face numerous challenges as the drives have progressively become smaller and denser, while storing more data and becoming more complex. In compact and/or advanced applications where space it at a premium, such as with mobile devices, there may be a greater need for drives that have a smaller outline or form factor, and are both heat-, and power-efficient. Additionally, many SSDs may be located in close proximity to one another, which may compound or exacerbate various heat-related problems, such as overheating. More generally, an SSD may be mounted in close proximity to other heat-producing or variously thermally-sensitive computing components, such as processors and memory. Other sources of heat, such as batteries, may also be present. So, as a result, SSDs typically produce and are subject to undesirable heat that can at times negatively affect performance and longevity. Therefore, the management and dissipation of heat related to an SSD, especially heat created during operation, is an important problem to be solved.

Thermal energy, the transfer or emission of which is called heat, is typically measured in calories, Joules, or British Thermal Units (BTU). Heat is typically measured in degrees of the Celsius, Kelvin, or Fahrenheit scales, as known. Thermal energy is the amount of energy the constituent atoms or molecules of a particular substance that is present due to internal molecular motion. The transfer or communication of thermal energy in the form of heat can take place variously through conduction, convection, and/or radiation. The terms communication and transfer, with regard to thermal energy, may be used interchangeably, herein. Communication or transfer may refer to conduction, convection, and/or radiation, of which conduction is generally preferred for efficient thermal energy transfer. Various connections or links between components may permit thermal conduction, etc., as used herein.

Conduction is the transfer of energy vibrations in matter through other matter, irrespective of relative movement of the molecules. Thermal energy transfer occurs at a higher rate across materials having certain physical properties of high thermal conductivity as compared to across materials or substances of low thermal conductivity. Any selected physical substance has a certain thermal conductivity, ranging from high (e.g., silver or copper) to low (e.g., fabric or wood). Correspondingly, materials of high thermal conductivity are widely used in heatsink applications, and materials of low thermal conductivity are used as thermal insulation. Additionally, thermal conductivity of materials is generally temperature-dependent and conductivity may be a non-linear function of temperature. Generally, conduction occurs across a physical connection between parts, or across areas within one contiguous structure.

Convection is the transfer of thermal energy through motion of the substance itself, such as gas or liquid, where a molecule of a substance moves or circulates from place to place, whereby thermal energy is transported from areas of higher heat to areas of lower heat, or from areas of high density of fluid to areas of low density. The transfer of thermal energy through radiation, however, generally occurs irrespective of a medium for transfer, and is a form of electromagnetic, infrared radiation. Various types of heat shields exist that may act to reduce the thermal transfer efficiency of any of the above-mentioned principles of heat transmission, but such heat shields may be more effective at reducing heat transfer due to radiation and convection, as compared to conduction, depending on the circumstances and configuration. Convection and/or radiation may still occur between distinct parts if a structure has a physical separation or gap between the parts. Conduction can occur through air as well, but in a more limited capacity and efficiency than through physical substances, generally.

In existing SSDs having multiple PCBs in a spaced, parallel arrangement, either nothing or a single internal mechanical or thermal barrier with or without thermal interface material (TIM) separates the PCBs. Some examples of TIM include thermal adhesive and thermal grease. Each PCB is roughly planar and flat, and may have components located on one or both sides of each PCB, such as a top and/or bottom of the PCB. In one example SSD, two PCBs are stacked with each PCB having an inner (on an inward-facing side of a particular PCB) and an outer side (on an outward-facing side of a particular PCB), with the two respective inner sides facing each other, and the two outer sides facing the drive housing (e.g., away from each other as respective outer surfaces). The components on the inner sides' surfaces (inner surfaces) generally have more difficulty (e.g., take more time for) dispersing and dissipating localized heat resulting from greater density of heat-producing components. For example, some components on the inner surfaces of the example two PCBs typically do not have a direct thermal path or conduit to the (e.g., air-cooled by convection) exterior of the drive, and may transfer heat to other adjacent components through which the heat reaches the exterior of the drive housing, before being carried away to a surrounding fluid environment, such as air. Other components may be located adjacent to or nearer to the exterior of the drive housing, as known. Adjacent components, as used herein, may be two or more components in thermal communication or otherwise in close or direct proximity with each other.

It is known that for various substances, thermal energy "seeks" equilibrium and transfers (in the form of heat) from areas of high thermal energy concentration to proximate areas of low concentration, with heat taking a path of least thermal resistance to reduce and equalize stored thermal energy at any particular location. Various thermal paths may exist in a PCB-based, SSD structure, such as heat conductance through a tangible material, convection through a gas, or radiation through electromagnetic radiation, as outlined above. Typically, conduction is substantially more efficient (e.g., more Joules transferred per unit time, such as Watts) and direct in transferring thermal energy than convection, although a rate of thermal conduction varies by substance, as described, above.

An SSD, once assembled, is typically composed of one or more PCBs enclosed in a drive housing having an exterior that is generally exposed to a fluid, such as air, and thus the exterior tends to be a cooler area of the SSD as compared to the internal, more removed from the exterior, components and areas. A drive housing may act as a heat sink, with the exterior emitting thermal energy in the form of radiation and/or convection. A typical heat sink is a passive device configured to absorb (and emit to a fluid, such as air) unwanted or excessive heat, generally from a nearby components attached thereto. In order for the thermal energy of internal SSD components to thermally be cooled by the internal heat reaching the drive housing, it is generally desirable to utilize conduction of heat where possible, using thermal paths from hot (generally internal) areas to cooler (generally external) areas, such as those receptive to air cooling. Additionally, a drive housing may contain various PCBs, with individual, separate heat profiles, that produce relatively more heat than another PCB at a particular moment in time. The heat production of one PCB may disadvantageously thermally affect another PCB, which may be more or less thermally-sensitive, or may, for other reasons, be adversely affected by heat produced by another PCB.

Some components in PCB-based devices may be more thermally sensitive, where, for example, performance thereof is adversely affected by heat above a certain temperature threshold. Alternatively, thermally-sensitive components may have progressively reduced performance as a temperature goes higher or lower than an ideal operating temperature. Examples of thermally-sensitive components that may be located on a PCB or in an SSD may include aluminum, film, polymer, and tantalum ceramic capacitors. On the other hand, some components may be less thermally-sensitive, and may operate under higher temperatures without severe or adverse effects on performance. Also thermally-sensitive may be inductors or transformers with wire coils, crystals, and plastic-based components. Non-solid-state relays and light-emitting diodes (LEDs) are additional examples of potentially thermally-sensitive components. Various thermally-sensitive components, such as electrolytic capacitors may be capable of surviving up to a threshold of, e.g., 120° Celsius, but may suffer drawbacks above that threshold. Various components may react differently to different amounts of heat, as known in the art.

Partially to separate or insulate the heat profiles of the respective PCBs, a typical drive may contain thermal and/or mechanical features, such as a metal or an insulating thermal barrier located between the respective PCBs. The barrier, particularly if not in a path of direct conductance, may at least partially isolate the respective thermal profiles of the PCBs, although the barrier may spread heat to the opposite PCBs more than desired. Therefore, there is a desire to find a more efficient structure for separating multiple thermal profiles of SSD PCBs, while efficiently dispersing heat from higher-heat areas, to relatively lower heat areas, such as a drive housing of an SSD.

SUMMARY

The present invention addresses and overcomes various thermal-related disadvantages and shortcomings of the prior art in data storage drives such as solid-state drives (SSDs). A thermal path is provided in an example drive between inner printed circuit board (PCB) components and an exterior of a drive housing without fully thermally linking two PCBs located within the drive.

By utilizing thermal and/or mechanical features in the drive housing of a multiple-PCB SSD, thermal contact is provided from variously thermally-sensitive components on inner surfaces of the multiple PCBs to the relatively cool exterior of the drive housing of an SSD, thereby improving thermal performance.

In one aspect of the present disclosure, an assembly includes a drive housing. The assembly also includes a first PCB with at least one solid-state memory component disposed thereon, the first PCB having a first surface, where the first PCB is located within the drive housing. The assembly also includes a second PCB with at least one solid-state memory component disposed thereon, where the second PCB is operatively electronically coupled to the first PCB, the second PCB having a second surface, and where the second PCB is located within the drive housing. The assembly also includes a first thermal transfer element configured for partial thermal communication between the first PCB and the second PCB through the first and second surfaces, where the first thermal transfer element is shaped to include a partially thermally insulating air gap located between the first and the second PCB, where a thermal interface material is disposed between the first thermal transfer element and the first PCB, and where the first thermal transfer element is in thermal communication with the drive housing.

Variations to this aspect of the present invention are also contemplated. According to one variation, the assembly further includes a frame located within the drive housing, where the frame is configured to support and guide placement of the first thermal transfer element within the drive housing. According to another variation, the frame is also configured to support and guide placement of the first and second PCB within the drive housing. According to another variation, the air gap is hermetically sealed. According to another variation, the first thermal transfer element is configured to at least partially thermally insulate the first PCB from the second PCB. According to another variation, the first and second PCBs are in a parallel and stacked arrangement. According to another variation, the air gap is formed by the first thermal transfer element joined to a second thermal transfer element. According to another variation, the first and second thermal transfer elements are formed by stamping. According to another variation, a thermal interface material is also disposed between the first thermal transfer element and the second PCB. According to another variation, the first thermal transfer element is a plate.

A second aspect of the present invention is directed to a method of making a storage drive. The method includes placing a first thermal transfer element within a drive housing, where the first thermal transfer element is configured to communicate thermal energy to the drive housing. The method also includes placing a first PCB within the drive housing, the first PCB having at least one solid-state memory component disposed thereon, where the first PCB is in thermal communication with the first thermal transfer element using thermal interface material (TIM). The method also includes placing a second PCB within the drive housing, the second PCB having at least one solid-state memory component disposed thereon, where the second PCB is in thermal communication with the first thermal transfer element using TIM, and is located opposite the first PCB. According to the method, the first thermal transfer element is configured to allow partial thermal communication between the first and second PCB, and where the first thermal transfer element includes a partially thermally insulating air gap located between the first and the second PCB.

Variations of methods of the present invention are also contemplated. According to one variation of the method, the first thermal transfer element is placed within the drive housing using a frame configured to support and guide placement of the first thermal transfer element within the drive housing. According to another variation of the method, the frame is also configured to support and guide placement of the first and second PCB within the drive housing. According to another variation of the method, the first and second PCBs are placed in the drive housing in a parallel and stacked arrangement. According to another variation of the method, the air gap is formed by the first thermal transfer element joined to a second thermal transfer element. According to another variation of the method, the first and second thermal transfer elements are formed by stamping.

Another aspect of the present invention is directed to a variation of an assembly including a drive housing. The assembly also includes a first printed circuit board (PCB) with at least one solid-state memory component disposed thereon, the first PCB having a first surface, and where the first PCB is located within the drive housing. The assembly also includes a second PCB with at least one solid-state memory component disposed thereon, wherein the second PCB is operatively electronically coupled to the first PCB, the second PCB having a second surface, and where the second PCB is located within the drive housing. The assembly also includes a first thermal transfer element configured for partial thermal communication with the first surface, where the first thermal transfer element includes a partially insulating air gap located between the first and the second PCB, where a thermal interface material is disposed between the first thermal transfer element and the first PCB, and where the first thermal transfer element is in thermal communication with the drive housing.

Variations of this aspect of the present invention are also contemplated. According to one variation, the assembly also includes a frame located within the drive housing, where the frame is configured to support and guide placement of the first thermal transfer element within the drive housing. According to another variation, the frame is also configured to support and guide placement of the first and second PCB within the drive housing. According to another variation, the first thermal transfer element is configured to at least partially thermally insulate the first PCB from the second PCB.

These and various other features and advantages will be apparent from a reading of the following detailed description.

BRIEF DESCRIPTION OF THE DRAWINGS

Other important objects and advantages of the present invention will be apparent from the following detailed description of the invention taken in connection with the accompanying drawings.

DETAILED DESCRIPTION

The foregoing specific embodiments of the present invention as set forth in the specification, herein, are for illustrative purposes only. Various deviations and modifications may be made within the spirit and scope of the invention without departing from the main theme thereof.

Figure 1:
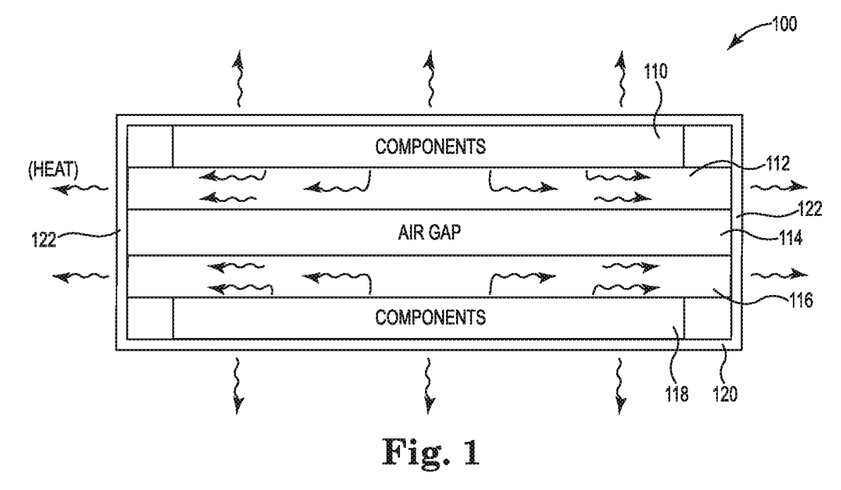
FIG. 1 is a conceptual heat path map of an example two-printed circuit board solid-state drive.

FIG. 1 is a conceptual heat path map of an example two-printed circuit board solid-state drive 100.

According to the shown conceptual heat path map, a solid-state drive (SSD) 100 includes two areas containing circuit components, including upper components 110 and lower components 118. Upper components 110 and lower components 118 may be PCB-based components, as described herein, and may be operatively electronically coupled to each other. For the purposes of this disclosure, operatively electronically coupled may denote any communicative, electronic, or electromagnetic-based coupling between components. The components 110, 118 may each include a printed circuit board (PCB) having the respective components 110, 118 located thereon. The components 110, 118 may be memory, storage, or other circuit-based components, as described herein. In one example, components 110, 118 are circuit-based storage components. Storage components, when a reading or writing operation is performed thereon, may produce and emit heat. The heat may be converted from received electricity at the storage components. Once produced, heat may seek to dissipate through distribution among various components located adjacent to or near the storage components 110, 118.

Produced thermal energy may take various paths and may transfer (as heat) to various components of SSD 100. An example, conceptual heat path map is shown, and selected individual heat paths are represented with arrows showing heat flowing from hotter to cooler areas, as described herein. According to the shown embodiment, produced heat may readily travel from components 110, 118 to a drive housing 120, which may preferably be formed of a material having high thermal conductivity and/or emittance (e.g., through radiation), such as various metals. Components 110, 118 may be located within the drive housing 120, and the components 110, 118 may have respective inner and outer surfaces (not shown individually in this conceptual depiction). The drive housing 120, as shown, is preferably formed and located such that it partially surrounds both upper components 110 and lower components 118, enclosing them. As shown, the drive housing 120 surrounds components 110, 118 on three sides each, but makes contact at one side of each (a respective outer surface). For example, upper components 110 contact the drive housing 120 at an upper (outer) surface, and lower components 118 contact the drive housing 120 at another, lower (outer) surface.

Once heat is created, the heat may take one or more thermal paths from the respective inner surface of components 110, 118 to the exterior of the drive housing 120, while creating a relatively non-conductive thermal barrier of air (air gap) 114 between the two PCBs and respective components. According to various embodiments, respective PCBs may have only inner-surface-mounted or only outer-surface-mounted components located thereon. Air gap 114, however, may function to transmit thermal energy in the form of convection and/or radiation, as described above. Where components 110, 118 contact drive housing directly, an efficient thermal path may be formed. The air gap 114 may partially insulate components 110, 118 from each other, but some thermal transmittance may be permitted through drive housing 120 at drive housing side edges 122. By partially or completely insulating components 110 and 118 from each other, less thermally-sensitive components on one PCB (e.g., components 110) may be permitted to get hotter without substantially affecting more thermally-sensitive components on the other PCB (e.g., components 118). Air gap 114 may be hermetically sealed, or partially open, according to various embodiments.

Components 110, 118 each have a respective inner surface and outer surface, as shown. The inner surfaces of components 110, 118 face in or toward the other respective components, and may be in contact with thermal channels including upper thermal channel 112 and lower thermal channel 116. The outer surfaces of components 110, 118 face out, or away from the other components, and may be in direct or indirect contact with drive housing 120. Thermal channels 112, 116 may be composed of a combination of one or more thermal transfer elements (which may be plates and may have thermal qualities, such as being conductive and/or reflective), thermal interface material (TIM), among other thermal components, which may be configured for efficient horizontal thermal communication, such as the transfer of thermal energy, preferably through conduction. Upper and lower thermal channels 112, 116 may preferably be configured to emit minimal heat (i.e., have low thermal emissivity) to the air gap 114, according to various embodiments. By locating thermal channels 112, 116 proximate to (and in thermal communication with) respective components 110, 118, a direct thermal contact and conductive path is formed, permitting relatively efficient flow of thermal energy from components 110, 118 to and through the respective thermal channels 112, 116.

An air gap 114 is shown located between the thermal channels 112, 116. The air gap 114 may be configured for convection through contained air, other fluid, or may be evacuated (be an airless vacuum), according to various embodiments, reducing a convective thermal-energy transfer rate (e.g., efficiency) or coefficient. Some thermal energy may be transferred through the air gap 114 through radiation, as described herein. Adjacent to the air gap 114, drive housing 120 may have side edges 122 where thermal channels 112, 116 or components 110, 118 come in thermal contact with one another, permitting thermal communication between the thermal channels 112, 116 to the drive housing 120. However, the thermal communication between thermal channels 112, 116 through side edges 122 may be limited by a cross-sectional area and thermal conductivity of side edges 122. The thermal conductivity of side edges may be very small when compared the thermal conductivity of the thermal channels 112, 116. Alternatively, the thermal channels 112, 116, and/or the components 110, 118 may not be in direct contact, and therefore thermal communication, with one another. Whether through side edges 122 or other areas, the drive housing 120 may permit at least partial thermal communication, e.g., conduction and thermal diffusion or dispersal, between various parts of SSD 100, similar in function to a heat sink, as described herein. At least some thermal conductivity of the drive housing 120 may be preferable for thermal purposes, such as cooling of components 110, 118 of SSD 100, described herein, according to various embodiments.

According to one example, at a particular time during SSD 100 operation, upper components 110 may be in use or active, and may be producing and emitting heat. In the example, the lower components 118 may be offline, in standby, or in other light, less demanding (e.g., low-heat) use. Therefore, as described, upper components 110 are producing relatively more heat, and lower components 118 are producing relatively less heat. In this example, it may be desirable to have lower components 118 be insulated from upper components 110 and the associated thermal energy, due to, for example, relative thermal sensitivity of upper components 110. Upper components 110, as shown, are in contact with upper thermal channel 112 through TIM or direct contact, and a high thermal conductivity and thermal energy transfer rate is achieved between upper components 110 and upper thermal channel 112. Upper thermal channel 112, may receive heat from upper components 110 and may contain thermal energy that characteristically desires an outlet from a hotter (higher thermal energy) to a cooler (lower thermal energy) region. Drive housing 120, as shown, is horizontally adjacent to thermal channel 112 on both left and right sides. The upper thermal channel 112, as shown, is also adjacent to air gap 114, which may act as a thermal barrier, as described herein. Thermal channel 116 is also adjacent to air gap 114. Convection and/or radiation through air gap 114 may be substantially less efficient (less thermal energy transferred per unit time across the air gap 114) at transferring thermal energy than through conduction. Conduction through substances configured for efficient heat transfer, such as TIM or metal, may be preferable, according to various embodiments.

In the above example, the upper thermal channel 112 transfers thermal energy (as heat) to the drive housing 120, where the heat is then preferably emitted through heat-sink-like emission and transfer to external fluid, such as air. Lower components 118 may be in use, but may be engaged in a different degree or type of use, for example, a lighter use that intentionally produces less heat or operates optimally at a lower temperature. In the example, the lower components 118 may be relatively insulated from the heat produced by the upper components 110, and may operate at a lower temperature, which may be advantageous to perform various operations. Heat produced by lower components 118 may, similar to upper components 110, conductively transfer to lower thermal channel 116, by which the heat may preferably communicate to the drive housing 120, though some thermal energy may also transfer through air gap 114 through convection and/or radiation, or around air gap 114 through side edges 122 to the other PCB and/or thermal transfer element. Components 110, 118 may be in direct contact with drive housing 120, which may transfer thermal energy to surrounding air or other external devices or structures (not shown), according to various embodiments.

FIGS. 2-5 represent more detailed cross-sectional views of various embodiments employing one or more concepts highlighted with respect to FIG. 1.

Figure 2:
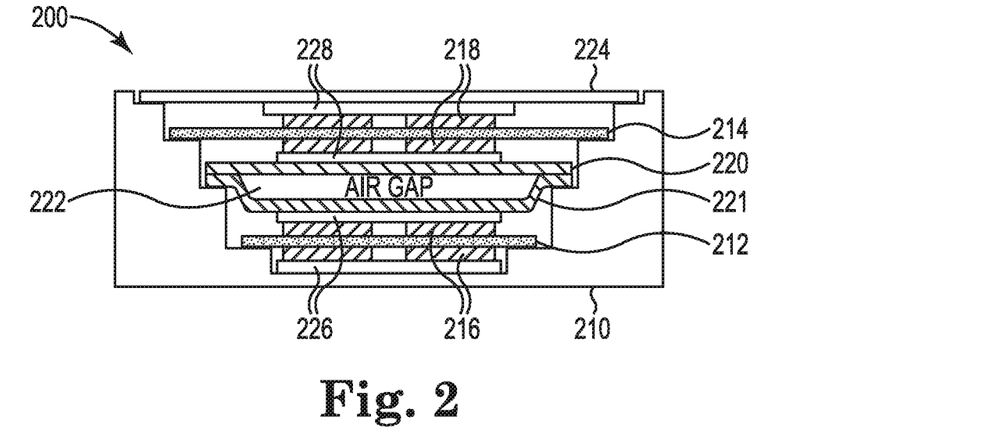
FIG. 2 is a cross-sectional view of a two-PCB SSD having a thermally-insulating air gap formed by and between two thermal transfer elements, according to various embodiments.

FIG. 2 is a cross-sectional view of a two-PCB SSD 200 having a thermally-insulating air gap 222 formed by and between two thermal transfer elements 220, 221, according to various embodiments.

As shown, a two-PCB SSD thermal structure 200 is configured to operate on a similar set of thermodynamic structures and principles as illustrated and described with respect to conceptual FIG. 1, according to various embodiments. SSD 200 includes an air gap 222 that is located between two thermal transfer elements, an upper thermal transfer element 220 and a lower thermal transfer element 221. Thermal transfer elements 220, 221 may be plates, according to various embodiments. SSD 200, as shown, also includes two PCBs, an upper PCB 214 and a lower PCB 212, which may be operatively electronically coupled to each other, and which are located within a drive housing 210, according to various embodiments. The thermal transfer elements 220, 221 at least partially thermally insulate the two PCBs 212, 214 from each other, assisted or facilitated by the thermal barrier of air gap 222. However, the thermal transfer elements 220, 221 also may at least partially conduct heat between PCBs 212, 214, e.g., similar to side edges 122 of FIG. 1. The thermal insulation afforded by air gap 222 may be a partial or a complete thermal insulation, according to various embodiments. The air gap 222 may employ and be formed by thermally-operative mechanical parts, such as one or more thermal transfer elements 220, 221. Thermal transfer elements 220, 221 may be composed of stainless steel, aluminum, copper, among other metals or plastics and substances with desirable thermal qualities, such as thermal shielding (reflectivity) and thermal conductivity. The thermal transfer elements 220, 221 may be created and configured to be placed against the inner surfaces of respective PCBs 214 and 212, and respective components, or TIM, such as upper TIM 228, or lower TIM 226, as shown. Thermal transfer elements 220, 221 may be plates or plate-like, and may be formed and shaped by various die-cast, folding, or stamping processes, as known, in order to precisely contour and fit to each other, a drive housing 210, support frame therein, and/or various components. Air gap 222 may be hermetically sealed or partially open, according to various embodiments.

In the shown embodiment, TIM 228, 226 preferably thermally couples the upper and lower PCBs 214, 212 to the respective upper and lower thermal transfer elements 220, 221. The upper and lower thermal transfer elements 220, 221 are placed such that they contact and are supported by the drive housing 210 at its edges (shown at left and right, similar to drive side edges 122 of FIG. 1), thereby completing a thermal transfer or communication path to draw heat away from the PCBs 214, 212 to the drive housing 210. The drive housing 210 may act as a heat sink for components contained therein, as described herein. The thermal transfer elements 220, 221 for each PCB 214, 212 are separated along most of their (horizontal) length by an air gap 222 and may preferably make little to no contact. Optional contact can occur at the side edges (left and right, as shown) of the thermal transfer elements 220, 221. If contact occurs (as shown), some thermal energy may be transmitted variously between thermal transfer elements 220, 221, and/or drive housing 210 according to thermal energy located in the various parts. Thermal transfer elements 220, 221 may be pressed, stamped, adhered, or otherwise held together at the respective side edges, according to various embodiments. Side edge contact, in combination with air gap 222, may create a useful structure for thermal transfer to drive housing edges.

Whether or not contact is made between thermal transfer elements 220, 221, the air gap 222, as shown, creates a thermally-insulating barrier between PCBs 214, 212. The thermal transfer elements 220, 221 create a pair of horizontal thermal communication paths or conduits in thermal transfer elements 220, 221. This may allow more thermally-sensitive components on one PCB to remain less affected by hotter, possibly less thermally-sensitive, components on the other, or vice-versa, as described herein. By design, less thermally-sensitive components may operate under higher temperatures than more thermally-sensitive components, according to various embodiments.

Drive housing 210 may have a support frame including a stepped internal shape and structure, as shown, which may be configured to support and guide insertion and placement of the first and second thermal transfer elements 220, 221 and/or first and second (lower and/or upper) PCBs 212, 214. Drive housing 210 may have a narrower internal width near a bottom of drive housing 210 and a wider internal width near an upper part of drive housing 210, as illustrate, near a drive housing cover 224. However, drive housing 210 and the associated components may not be drawn to scale, as shown. Drive housing 210 may have a box-like, more uniform rectangular-solid exterior, as further seen with respect to fully-assembled SSD of FIGS. 6B-6C.

To assemble or make example SSD 200, a lower (e.g., first) PCB 212 with lower components 216 may have lower TIM 226 applied to the lower components 216 and the lower PCB 212 may be inserted or placed in, and supported by, drive housing 210. Lower components 216 may be located on top and bottom of lower PCB 212, as shown. Similarly, lower TIM 226 may be applied on respective top and bottom lower components 216, among other surfaces, as appropriate. Lower TIM 226 may be applied at respective sides of lower components 216, as shown, or may be applied in other known configurations. Lower TIM 226, components 216 and PCB 212 may be assembled together before insertion and placement into drive housing 210, or may be inserted sequentially from bottom to top, according to various embodiments. Following the placement of lower PCB 212, components 216, and TIM 226 into drive housing 210, both upper and lower thermal transfer elements 220, 221 may be placed in drive housing 210 and lower thermal transfer element 221 may contact lower TIM 226 of lower PCB 212 (having lower components 216 located thereon). An air gap 222 may be formed upon placement of thermal transfer elements 220, 221 into drive housing 210.

According to one embodiment, thermal transfer elements 220, 221 may be formed, e.g., by stamping, and joined together prior to placement into drive housing 210, forming the air gap 222. As shown, thermal transfer elements 220, 221 are joined together at the (left and right) side edges only. Alternatively, lower thermal transfer element 221 may be inserted into drive housing 210 first, with upper thermal transfer element 220 inserted following, creating the air gap 222 during assembly of SSD 200. Following the insertion and placement of thermal transfer elements 220, 221, a second, upper PCB 214 (having upper components 218 located thereon) may be placed into drive housing 210, preferably contacting upper thermal transfer element 220 with upper TIM 228, in order to complete a thermal path from upper PCB 214 to upper thermal transfer element 220. Upper components 218 may be located on top and bottom of upper PCB 214, as shown. Similarly, upper TIM 228 may be applied on respective top and bottom upper components 218, among other surfaces, as appropriate. Drive housing 210 may have one (upper, as shown) open end, and may be configured to receive a drive housing cover 224 for placement, in order to form a sealed SSD 200. The drive housing cover 224 may then enclose drive housing 210 on an open end, and the SSD 200 may be complete. After receiving the drive housing cover 224, the drive housing 210 and drive housing cover 224 may together form a single drive housing 210 for thermal purposes, herein. Examples of complete SSD 200 may be similar to the views shown in FIGS. 6B and 6C.

Figure 3:
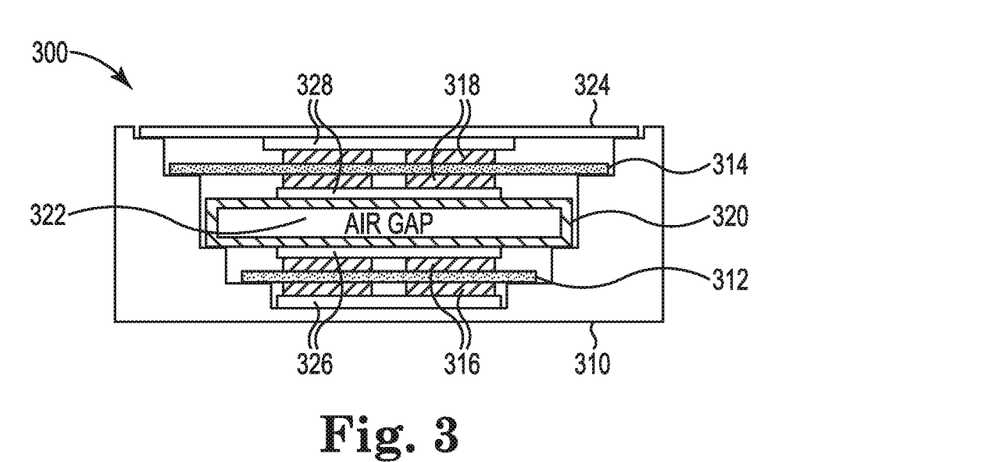
FIG. 3 is a cross-sectional view of a two-PCB SSD having a thermally-insulating air gap formed by a single thermal transfer element, according to various embodiments.

FIG. 3 is a cross-sectional view of a two-PCB SSD 300 having a thermally-insulating air gap 322 formed by a single thermal transfer element 320, according to various embodiments.

SSD 300 has a similar structure and layout to SSD 200 of FIG. 2, with an exception that a single thermal transfer element 320 forms, defines, and optionally entirely surrounds an air gap 322, which may be sealed hermetically or be partially open, according to various embodiments. The air gap 322 is located within thermal transfer element 320, and between two PCBs 312, 314, which are located within a drive housing 310, and which may be operatively electronically coupled to each other and associated components, creating a thermally-insulating barrier similar to air gap 222 of FIG. 2. The thermal transfer element 320 may be a single, purpose-built part created to be placed so as to rest against the inner surfaces of respective PCBs 314 and 312, and respective components, or TIM 328, 326, of a particular configuration, as shown. Thermal transfer element 320 may be formed and shaped by various processes, as known, including milling, or stamping, where various parts may then be joined by, for example, welding, bolting, gluing, etc. Drive housing 310 is likewise shaped to fit thermal transfer element 320 and associated components. In the shown embodiment, TIM 328, 326 preferably thermally connects or links the PCBs 314, 312 to the thermal transfer element 320 which contacts a drive housing 310 at its edges (shown at left and right, may be similar to edges 122 shown in FIG. 1) and completes a thermal energy communication path to draw heat away from the PCBs 314, 312 to the drive housing 310. Thermal transfer element 320 may have high thermal conductivity in order to channel heat around air gap 322 to the drive housing 310. The thermal transfer element 320, including air gap 322, may form a structure having low vertical thermal conductivity from top to bottom, creating a partially thermally-insulating barrier, between PCBs 314, 312 in addition to a horizontal thermal transfer path or conduit. This may allow more thermally-sensitive components on one PCB (e.g., PCB 314) to remain unaffected or less affected by hotter components on the other PCB (e.g., PCB 312), as described herein.

Drive housing 310 may include a support frame having a stepped internal shape and structure, as shown, which may be configured to support and guide placement of the thermal transfer element 320 and/or first and second PCB 312, 314. Drive housing 310 may have a narrower internal width near a bottom of drive housing 310 and a wider internal width near an upper part of drive housing 310, near a drive housing cover 324. However, drive housing 310 may not be drawn to scale, as shown. Drive housing 310 may have a more uniform, box-like, rectangular solid exterior, as further seen with respect to assembled SSD of FIGS. 6B-6C.

To assemble or make example SSD 300, a lower (e.g., first) PCB 312 and lower components 316 may have lower TIM 326 applied to the lower components 316 and the lower PCB 312 may be inserted or placed in, and supported by, drive housing 310. Lower components 316 may be located on top and bottom of lower PCB 312, as shown. Similarly, lower TIM 326 may be applied on respective top and bottom lower components 316, among other surfaces, as appropriate. Lower TIM 326 may be applied at respective sides of lower components 316, as shown, or may be applied in other known configurations. Lower TIM 326, components 316 and PCB 312 may be assembled together before insertion into drive housing 310, or may be inserted sequentially from bottom to top, according to various embodiments. Following the placement of lower PCB 312 (having upper components 318 located thereon), components 316, and TIM 326, thermal transfer element 320 may be placed in drive housing 310 and thermal transfer element 320 may contact bottom TIM 326 of lower PCB 312.

Following the placement of thermal transfer element 320, a second (upper) PCB 314 may be inserted into drive housing 310, preferably contacting thermal transfer element 320 with upper TIM 328, in order to complete a thermal path from upper PCB 314 to thermal transfer element 320. Upper components 318 may be located on top and bottom of upper PCB 314, as shown. Similarly, upper TIM 328 may be applied on respective top and bottom upper components 314, among other surfaces, as appropriate. Drive housing 310 may have one (upper, as shown) open end, and may be configured to receive a drive housing cover 324 in order to form a sealed SSD 300. The drive housing cover 324 may then enclose drive housing 310 at an open end, and the SSD 300 may be assembled and complete. After receiving the drive housing cover 324, the drive housing 310 and drive housing cover 324 may together form a single drive housing 310 for thermal purposes, herein. Examples of assembled SSD 300 may be similar to the views shown in FIGS. 6B and 6C.

Figure 4:
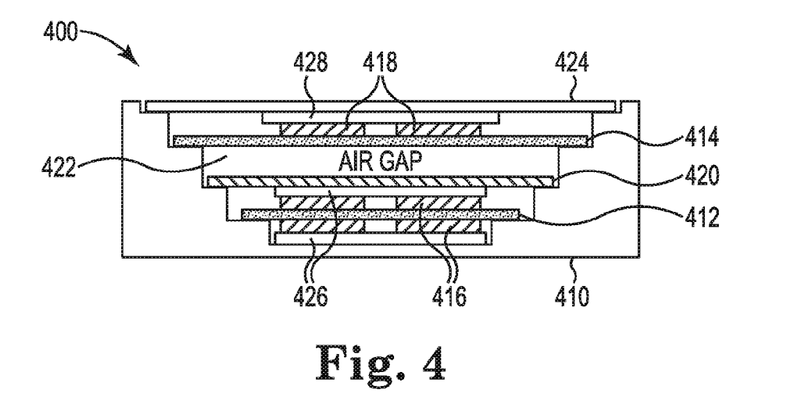
FIG. 4 is a cross-sectional view of a two-PCB SSD having a thermally-insulating air gap formed between a single thermal transfer element and an upper PCB that has a less thermally-sensitive inner surface, according to various embodiments.

FIG. 4 is a cross-sectional view of a two-PCB SSD 400 having a thermally-insulating air gap 422 formed between a single thermal transfer element 420 and an upper PCB 414 that has a less thermally-sensitive inner surface, according to various embodiments.

SSD 400 may be similar to SSD 200 or 300, but is designed such as for use where one (lower) PCB 412 that is more thermally-sensitive, having a thermal transfer element 420 and one (upper) PCB 414 that has at least one side (e.g., the inner surface) that either lacks thermally-sensitive components or is otherwise less thermally sensitive, possibly reducing a desire for a second thermal transfer element in order to form air gap 422. As illustrated, the bottom side of the upper PCB 414 does not include upper components 418 as are shown on its top surface.

The air gap 422 is located between two PCBs, including upper PCB 414, and lower PCB 412, which may be operatively electronically coupled to each other, and associated components, creating a thermally-insulating barrier. PCBs 412, 414 may be inserted or placed into, and supported by, a drive housing 410. The thermal transfer element 420 may be created to rest against the inner surface of lower PCB 412, and respective components 416, or a lower TIM 426, as shown. Thermal transfer element 420 may be formed and shaped using various processes, as known, The drive housing 410 is likewise shaped as a support frame to fit thermal transfer element 420 and associated components in addition to (at least partially thermally-sensitive) upper PCB 414, according to various embodiments.

In an embodiment, as shown, lower TIM 426 preferably thermally links the lower PCB 412 to the thermal transfer element 420, which contacts a drive housing 410 for an SSD at various drive housing 410 edges (shown at left and right, may be similar to edges 122 of FIG. 1) and completes a thermal communication path to draw heat away from the lower PCB 412 to the drive housing 410. Thermal transfer element 420 may preferably be characterized by high thermally conductivity in order to facilitate channeling heat around air gap 422 to the drive housing 410. The thermal transfer element 420, together with upper PCB 414, forms an air gap 422, which may further form a structure having little or no thermal communication, e.g., characterized by low thermal conductivity, from top to bottom, (e.g., from PCB 414 to 412, and vice-versa) creating an at least partially thermally-insulating barrier, in addition to a pair of horizontal thermal paths or conduits. This may allow more thermally-sensitive components on PCB 414 (possibly desiring operation at lower temperatures) to remain unaffected or less affected by hotter components on the other PCB 412, which may be less thermally-sensitive, as described herein.

Drive housing 410 may have a support frame including a stepped internal shape and structure, as shown, which may be configured to support and guide placement of the thermal transfer element 420 and/or first and second PCB 412, 414. Drive housing 410 may have a narrower internal width near a bottom of drive housing 410 and a wider internal width near a top of drive housing 410, near a drive housing cover 424, according to various embodiments, or may take another shape. However, drive housing 410 may not be drawn to scale, as shown. Drive housing 410 may have may have a box-like, more uniform rectangular-solid exterior, as further seen with respect to assembled SSD of FIGS. 6B-6C.

To assemble or make example SSD 400, a lower (e.g., first) PCB 412 and lower components 416 may have lower TIM 426 applied to the lower components 416 and the lower PCB 412 may be inserted or placed in, and supported by, drive housing 410. Lower components 416 may be located on top and bottom of lower PCB 412, as shown. Similarly, lower TIM 426 may be applied on respective top and bottom lower components 416, among other surfaces, as appropriate. Lower TIM 426 may be applied at respective sides of lower components 416, as shown, or may be applied in other known configurations. Lower TIM 426, components 416 and PCB 412 may be assembled together before insertion into drive housing 410, or may be inserted or placed sequentially from bottom to top, according to various embodiments. Following the placement of lower PCB 412, components 416, and TIM 426, thermal transfer element 420 may be placed in drive housing 410 and thermal transfer element 420 may contact lower TIM 426 of lower PCB 412. Following the placement of thermal transfer element 420, a second (upper) PCB 414 may be inserted or placed into, and supported by, drive housing 410 forming an air gap 422 between the upper PCB 414 and thermal transfer element 420. The air gap 422 may be hermetically sealed, according to various embodiments. Upper components 418 may be located on top of upper PCB 414, as shown. Similarly, upper TIM 428 may be applied on top upper components 414, among other surfaces, as appropriate. Drive housing 410 may have one (upper, as shown) open end, and may be configured to receive a drive housing cover 424 in order to form a sealed SSD 400. The drive housing cover 424 may then enclose drive housing 410 on an open end, and the SSD 400 may be assembled and complete. After receiving the drive housing cover 424, the drive housing 410 and drive housing cover 424 may together form a single drive housing 410 for thermal purposes, herein. Examples of assembled SSD 400 may be similar to the views of assembled SSD 602 shown in FIGS. 6B and 6C.

Figure 5:
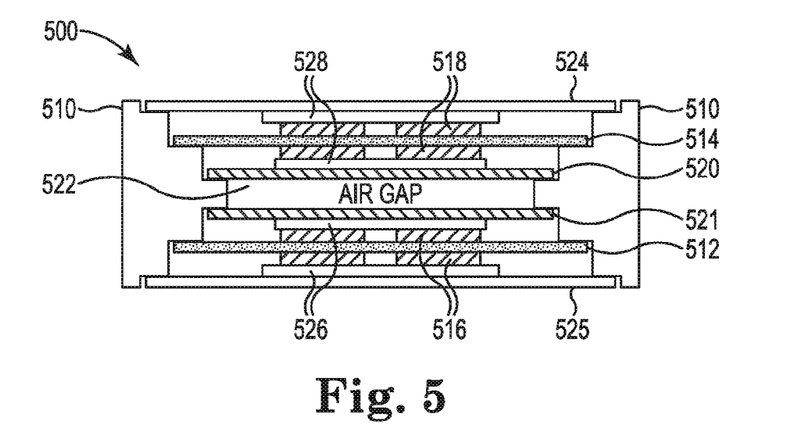
FIG. 5 is a cross-sectional view of a two-PCB SSD having a thermally-insulating air gap formed by and between two thermal transfer elements, according to various embodiments.

FIG. 5 is a cross-sectional view of a two-PCB SSD 500 having a thermally-insulating air gap 522 formed by and between two thermal transfer elements 520, 521, according to various embodiments.

SSD 500 may be similar to SSD 200, 300, or 400, but has a drive housing 510 that is formed to be accessible from both upper cover 524 and lower cover 525. Drive housing 510, as shown, may be preferably formed through an extrusion process, or by casting and machining, according to various embodiments. Drive housing 510 may begin as a piece of metal, and may be extruded and/or cut into a chosen shape, as described herein. Drive housing 510 may have a support frame including a stepped internal shape and structure, as shown, which may be configured to support and guide placement of the first and second thermal transfer elements 520, 521 and/or first and second PCB 512, 514, but may maintain a stepped internal configuration for guiding installation of PCBs 512 and 514, which may be inserted or placed into, and supported by, drive housing 510, according to various embodiments.

An air gap 522 is located between two thermal transfer elements; upper thermal transfer element 520, and lower thermal transfer element 521, and respective upper and lower PCBs 512, 514, which may be operatively electronically coupled to each other, and associated components, thereby creating a thermally-insulating barrier. The thermal transfer elements 520, 521 may be created to rest against an inner surfaces of drive housing 510, and respective PCBs 512, 514, or upper and lower TIM 524, 526, as shown. Thermal transfer elements 520, 521 may be formed and shaped by various processes, as known. A drive housing, as shown, 510 is likewise shaped to fit thermal transfer elements 520, 521 and associated components, in addition to PCBs 512, 514. In the shown embodiment, lower TIM 526 preferably thermally links the PCB 512 to the lower thermal transfer element 521, which contacts a drive housing 510 at its edges (shown at left and right, may be similar to edges 122 of FIG. 1) and completes a thermal communication path to draw heat away from the PCB 512 to the drive housing 510.

Likewise, upper TIM 528 preferably thermally links the PCB 514 to the upper thermal transfer element 520 which contacts a drive housing 510 at its edges (shown at left and right) and completes a thermal path or conduit to draw heat away from the PCB 514 to the drive housing 510. Thermal transfer elements 520, 521 may be configured to have high thermal conductivity in order to channel and transfer heat around air gap 522 to the drive housing 510. The thermal transfer elements 520, 521 form an air gap 522 that may allow for little or no thermal communication, e.g., by having low thermal conductivity, from top to bottom, (e.g., from PCB 514 to 512, and vice-versa) creating an at least partially thermally-insulating barrier, in addition to a pair of horizontal thermal paths or conduits. The above may allow more thermally-sensitive components on upper PCB 514 to remain unaffected or less affected by hotter components on the lower PCB 512, or vice-versa, if the sensitivities of the PCBs were reversed, as described herein.

Drive housing 510 may have a two-sided (top and bottom) stepped internal support frame having a structure and shape, as shown. Drive housing 510 may have a narrower internal width near a vertical middle of drive housing 510 and a wider internal width near a top and bottom of drive housing 510, near a drive housing covers 524, 525. However, drive housing 510 may not be drawn to scale, as shown. Drive housing 510 may have a may have a box-like, more uniform rectangular-solid exterior, as further seen with respect to assembled SSD of FIGS. 6B-6C.

To assemble or make example SSD 500, a lower (e.g., first) thermal transfer element 521 may be placed into drive housing 510 from below (as illustrated), and may abut an inner-most support step of drive housing 510 stepped internal support frame. A lower (e.g., first) PCB 512 and lower components 516 may have lower TIM 526 applied to the lower components 516 and the lower PCB 512 may be inserted or placed into, and supported by, drive housing 510, from below, as shown. Lower components 516 may be located on top and bottom of lower PCB 512, as shown. Similarly, lower TIM 526 may be applied on respective top and bottom lower components 516, among other surfaces, as appropriate. Upper components 518 may be located on top and bottom of upper PCB 514, as shown. Similarly, upper TIM 528 may be applied on respective top and bottom upper components 514, among other surfaces, as appropriate. Lower TIM 526 may be applied at respective sides of lower components 516, as shown, or may be applied in other known configurations. Lower TIM 526, components 516, and PCB 512 may be assembled together before insertion and placement into drive housing 510, or may be inserted sequentially from top to bottom, according to various embodiments. A lower drive housing cover 525 may then enclose drive housing 510 at an open lower end. Following the placement of lower PCB 512, components 516, and TIM 526, an upper (e.g., second) thermal transfer element 520 may be placed in drive housing 510 above lower thermal transfer element 521, as shown. Upon placement of thermal transfer elements 520, 521 into drive housing 510, an air gap 522 may be formed, which may be hermetically sealed, or partially open.

Following the placement of thermal transfer elements 520, 521, a second, upper PCB 514 may be inserted or placed into drive housing 510 from above, preferably contacting upper thermal transfer element 520 with TIM 528, in order to complete a thermal communication path from upper PCB 514 to upper thermal transfer element 520. Thermal transfer elements 520, 521 may be configured to allow partial thermal communication between PCBs 512 and 514, according to various embodiments. Thermal transfer elements 520, 521, individually or in combination may form, include or surround the air gap 522, which may be partially thermally insulating, and which may be located between the PCBs 512, 514.

Drive housing 510 may have one (upper, as shown) open end, and may be configured to receive a drive housing cover 524 in order to form a sealed SSD 500. The drive housing covers 524, 525 may then enclose drive housing 510 on upper and lower open ends, and the SSD 500 may be assembled and complete. After receiving the drive housing covers 524, 525, the drive housing 510 and drive housing covers 524, 525 may together form a single drive housing 510 for thermal purposes, herein. Examples of assembled SSD 500 may be similar to the views shown in FIGS. 6B and 6C, except being modified to have upper and lower drive housing covers 524, 525.

Figure 6A:
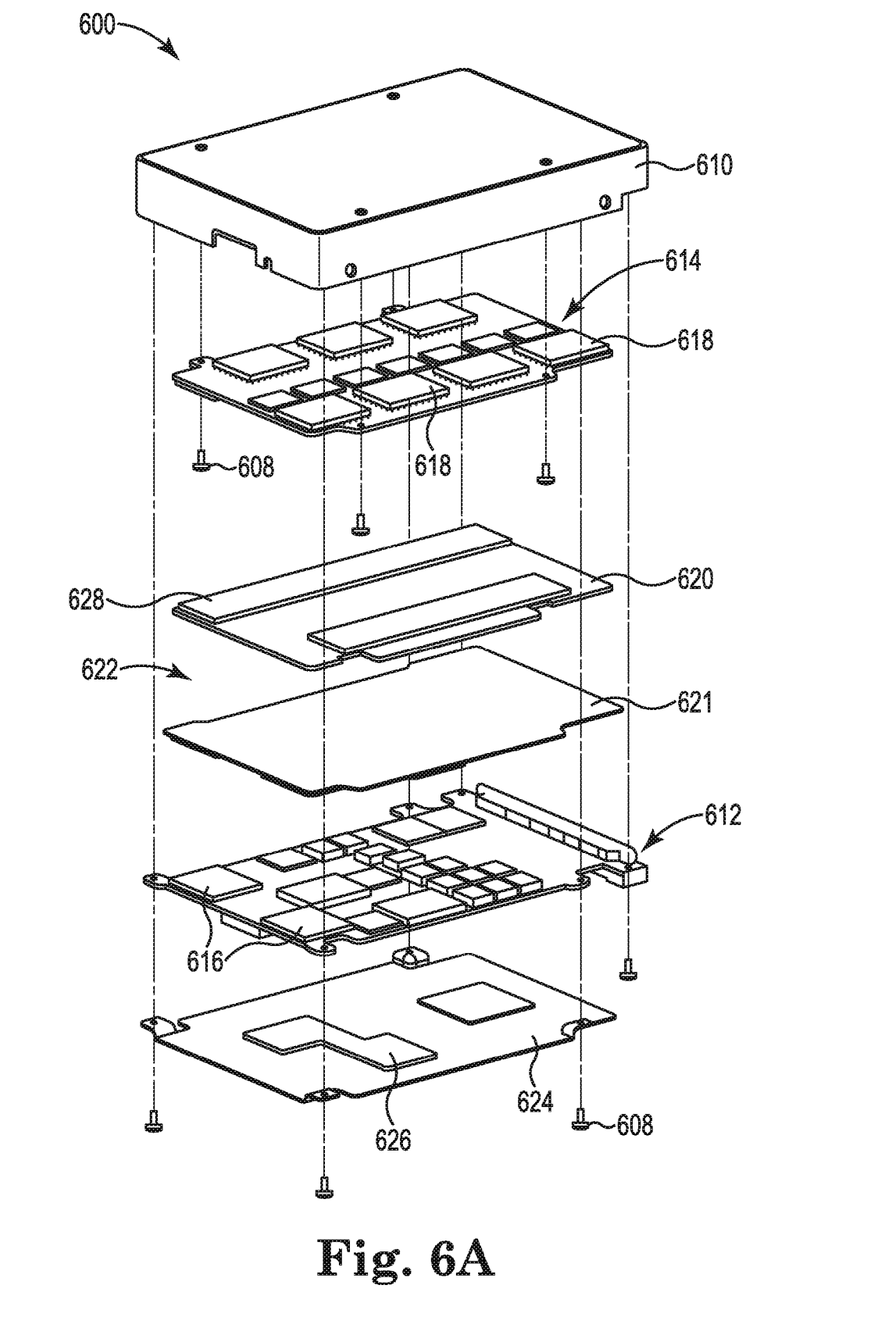
FIG. 6A is an exploded view of an example two-PCB, two-thermal transfer element SSD, according to various embodiments.

FIG. 6A is an exploded view of an example two-PCB, two-thermal transfer element SSD 600, according to various embodiments.

SSD 600 may be composed of multiple stacked components when assembled, including two PCBs, including an upper PCB 614 and a lower PCB 612, which may be operatively electronically coupled to each other, according to various embodiments. PCBs 612, 614 may be located within drive housing 610, when assembled, according to various embodiments. SSD 600 may also include two thermal transfer elements; upper thermal transfer element 620, and lower thermal transfer element 621, and a drive housing cover 624 configured to enclose various components in conjunction with drive housing 610. PCBs 612, 614 may be in thermal communication with drive housing 610, through thermal transfer elements 620, 621.

The various components may be secured or fastened to one another using various fasteners 608, such as screws, as shown, and/or standoffs, among other mounting hardware and structures. When fastened, the two thermal transfer elements 620, 621 may be secured at a fixed distance from each other, forming an air gap 622, which may be hermetically sealed, or partially open, as described herein. The PCBs 614, 612 include respective storage or memory components; upper components 618, and lower components 616 located thereon, respectively, as shown. The components 618, 616 may be located on one or both sides of each PCB 614, 612. Upper TIM 628 can be located on the (top and/or bottom of) upper thermal transfer element 620, and lower TIM 621 can be located on the (top and/or bottom of) on lower thermal transfer element 621, as shown where visible. Respective upper and lower TIM 628, 626 also contacts drive housing 610 and drive housing cover 626, as shown, and may be configured to improve thermal communication through increased thermal conductivity or thermal energy transfer efficiency, as described herein.

The various components and materials may contact, fasten, or secure to the drive housing 610 in various ways, such as being fastened in place using screws, hook-like snap features, by pressure, or other ways, as known in the art. According to a preferred embodiment, the various components may be held together with pressure in combination with fasteners (such as screws or bolts) and/or standoffs.

Figure 6B:
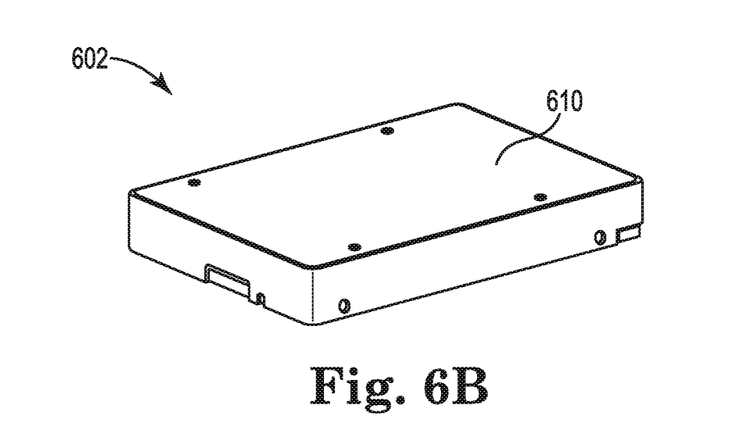
FIG. 6B is a top perspective view of an example two-thermal transfer element SSD, which may be similar to the SSD of FIG. 6A, but is fully assembled, according to various embodiments.

FIG. 6B is a top perspective view of an example two-thermal transfer element SSD 602, which may be similar to SSD 600 of FIG. 6A, but is fully assembled, according to various embodiments. The shown SSD 602 may be composed of similar components and may have a similar structure to SSD 600 shown in FIG. 6A. The shown view of SSD 602 shows drive housing 610, as described with respect to FIG. 6A.

Figure 6C:
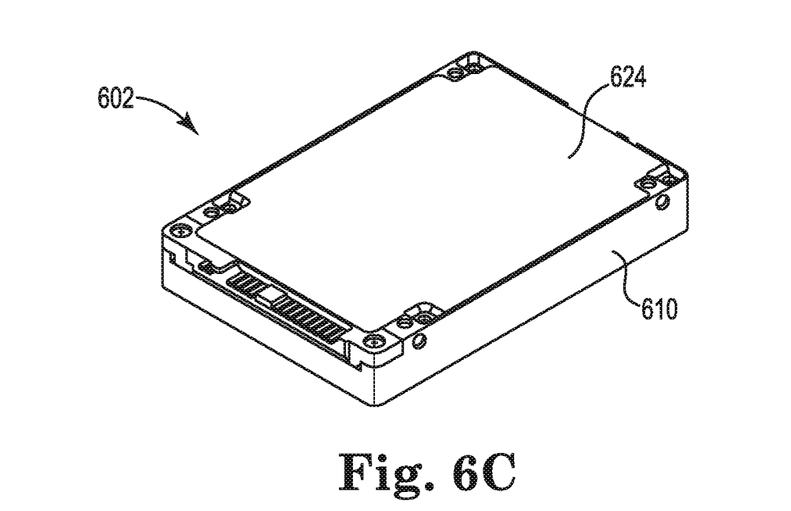
FIG. 6C is a bottom perspective view of an example two-thermal transfer element SSD, which may be similar to the SSD of FIG. 6A, but is fully assembled, according to various embodiments.

FIG. 6C is a bottom perspective view of an example two-thermal transfer element SSD 602, which may be similar to SSD 600 of FIG. 6A, but is fully assembled, according to various embodiments. The shown SSD 602 may be composed of similar components and may have a similar structure to SSD 600 shown in FIG. 6A. The shown view of SSD 602 shows drive housing 610, as described with respect to FIG. 6A in addition to drive housing cover 624.

Reference is made herein to the accompanying drawings, which form a part hereof and in which are shown by way of illustration at least one specific embodiment. The detailed description provides additional specific embodiments. It is to be understood that other embodiments are contemplated and may be made without departing from the scope or spirit of the present disclosure. The detailed description, therefore, is not to be taken in a limiting sense. While the present disclosure is not so limited, an appreciation of various aspects of the invention will be gained through a discussion of the examples provided.

It is understood that numerous variations of SSDs having internal thermal transfer elements forming an air gap could be made while maintaining the overall inventive design of various components thereof and remaining within the scope of the disclosure. Numerous alternate design or element features have been mentioned above.

As used herein, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

Thus, embodiments of the SSDs having internal thermal transfer elements forming an air gap are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. An assembly, comprising:
   a drive housing;
   a first printed circuit board (PCB) with a first solid-state memory component disposed thereon, the first PCB having a first surface, wherein the first PCB is located within the drive housing;
   a second PCB with a second solid-state memory component disposed thereon, wherein the second PCB is operatively electronically coupled to the first PCB, the second PCB having a second surface, and wherein the second PCB is located within the drive housing; and
   a first thermal transfer element configured for partial thermal communication between the first PCB and the second PCB through the first and second surfaces, wherein the first thermal transfer element is supported relative to the drive housing and is shaped to include a partially thermally insulating air gap located between the first and the second PCB, wherein a first thermal interface material is disposed between the first thermal transfer element and the first PCB, and wherein the first thermal transfer element is in thermal communication with the drive housing by way of its support relative to the drive housing.

2. The assembly of claim 1, further comprising:
   a frame located within the drive housing, wherein the frame is configured to support and guide placement of the first thermal transfer element within the drive housing.

3. The assembly of claim 2, wherein the frame is also configured to support and guide placement of the first and second PCB within the drive housing.

4. The assembly of claim 1, wherein the air gap is hermetically sealed.

5. The assembly of claim 1, wherein the first thermal transfer element is configured to at least partially thermally insulate the first PCB from the second PCB.

6. The assembly of claim 1, wherein the first and second PCBs are in a parallel and stacked arrangement.

7. The assembly of claim 1, wherein the air gap is formed by the first thermal transfer element joined to a second thermal transfer element.

8. The assembly of claim 7, wherein the first and second thermal transfer elements are formed by stamping.

9. The assembly of claim 1, wherein a second thermal interface material is also disposed between the first thermal transfer element and the second PCB.

10. The assembly of claim 1, wherein the first thermal transfer element is a plate.

11. A method of making a storage drive, comprising:
    supporting a first thermal transfer element within and relative to a drive housing, wherein the first thermal transfer element is configured to communicate thermal energy to the drive housing by way of a manner of supporting the first thermal transfer element relative to the drive housing;
    placing a first printed circuit board (PCB) within the drive housing, the first PCB having a first solid-state memory component disposed thereon, wherein the first PCB is in thermal communication with the first thermal transfer element using a first thermal interface material (TIM);
    placing a second PCB within the drive housing, the second PCB having a second solid-state memory component disposed thereon, wherein the second PCB is in thermal communication with the first thermal transfer element using a second TIM, and is located opposite the first PCB; and
    wherein the first thermal transfer element is configured to allow partial thermal communication between the first and second PCB, and wherein the first thermal transfer element includes a partially thermally insulating air gap located between the first and the second PCB.

12. The method of claim 11, wherein the first thermal transfer element is placed within the drive housing using a frame configured to support and guide placement of the first thermal transfer element within the drive housing.

13. The method of claim 12, wherein the frame is also configured to support and guide placement of the first and second PCB within the drive housing.

14. The method of claim 11, wherein the first and second PCBs are placed in the drive housing in a parallel and stacked arrangement.

15. The method of claim 11, wherein the air gap is formed by the first thermal transfer element joined to a second thermal transfer element.

16. The method of claim 15, wherein the first and second thermal transfer elements are formed by stamping.

17. An assembly, comprising:
    a drive housing;
    a first printed circuit board (PCB) with a first solid-state memory component disposed thereon, the first PCB having a first surface, and wherein the first PCB is located within the drive housing;
    a second PCB with a second solid-state memory component disposed thereon, wherein the second PCB is operatively electronically coupled to the first PCB, the second PCB having a second surface, and wherein the second PCB is located within the drive housing;
    a first thermal transfer element configured for partial thermal communication with the first surface, wherein the first thermal transfer element includes a partially thermally insulating air gap located between the first PCB and the second PCB, wherein a first thermal interface material is disposed between the first thermal transfer element and the first PCB, and wherein the first thermal transfer element is in thermal communication with the drive housing; and a frame located within the drive housing, wherein the frame is configured to support and guide placement of the first thermal transfer element within the drive housing.

18. The assembly of claim 17, wherein the frame is also configured to support and guide placement of the first and second PCB within the drive housing.

19. The assembly of claim 17, wherein the first thermal transfer element is configured to at least partially thermally insulate the first PCB from the second PCB.

20. The assembly of claim 17, wherein a second thermal interface material is also disposed between the first thermal transfer element and the second PCB.

* * * * *